(12) United States Patent
Okada et al.

(10) Patent No.: US 8,941,174 B2
(45) Date of Patent: Jan. 27, 2015

(54) SEMICONDUCTOR DEVICE AND METHOD FOR PRODUCING THE SAME

(75) Inventors: Masaya Okada, Osaka (JP); Makoto Kiyama, Itami (JP); Yu Saitoh, Itami (JP); Seiji Yaegashi, Tokyo (JP); Mitsunori Yokoyama, Tokyo (JP); Kazutaka Inoue, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/885,131

(22) PCT Filed: Oct. 17, 2011

(86) PCT No.: PCT/JP2011/073828
§ 371 (c)(1),
(2), (4) Date: May 13, 2013

(87) PCT Pub. No.: WO2012/066892
PCT Pub. Date: May 24, 2012

(65) Prior Publication Data
US 2013/0234156 A1    Sep. 12, 2013

(30) Foreign Application Priority Data
Nov. 15, 2010   (JP) .................................. 2010-255007

(51) Int. Cl.
*H01L 29/66* (2006.01)
*H01L 29/78* (2006.01)
(Continued)

(52) U.S. Cl.
CPC ...... *H01L 29/7813* (2013.01); *H01L 29/66462* (2013.01); *H01L 29/7788* (2013.01);
(Continued)

(58) Field of Classification Search
USPC ............. 257/76, E27.091, E29.257, 302, 330
See application file for complete search history.

(56) References Cited

U.S. PATENT DOCUMENTS 7,592,647 B2 *  9/2009  Nakata et al. .................. 257/194
2009/0321854 A1 * 12/2009  Ohta et al. ..................... 257/411

FOREIGN PATENT DOCUMENTS

JP    10-098188 A    4/1998
JP    2006-286942 A  10/2006
(Continued)

OTHER PUBLICATIONS

International Search Report in PCT International Patent Application No. PCT/JP2011/073828, dated Dec. 27, 2011.

*Primary Examiner* — Timor Karimy
(74) *Attorney, Agent, or Firm* — Venable LLP; Michael A. Sartori; Tamatane J. Aga

(57) ABSTRACT

It is an object to improve the breakdown voltage characteristics of a vertical semiconductor device having an opening and including a channel formed of two-dimensional electron gas in the opening. A GaN-based stacked layer 15 includes $n^-$-type GaN drift layer 4/p-type GaN barrier layer 6/$n^+$-type GaN contact layer 7. An opening 28 extends from a top layer and reaches the $n^-$-type GaN drift layer 4. The semiconductor device includes a regrown layer 27 located so as to cover a wall surface and a bottom portion of the opening, the regrown layer 27 including an electron drift layer 22 and an electron source layer 26, a source electrode S located around the opening, a gate electrode G located on the regrown layer in the opening, and a bottom insulating layer 37 located in the bottom portion of the opening.

4 Claims, 5 Drawing Sheets

(51) Int. Cl.
*H01L 29/778* (2006.01)
*H01L 29/20* (2006.01)
*H01L 29/417* (2006.01)
*H01L 29/423* (2006.01)

(52) U.S. Cl.
CPC ...... *H01L29/7789* (2013.01); *H01L 29/66734* (2013.01); *H01L 29/2003* (2013.01); *H01L 29/41766* (2013.01); *H01L 29/42368* (2013.01); *H01L 29/78* (2013.01)

USPC ...... 257/330; 257/76; 257/302; 257/E27.091; 257/E29.257

(56) References Cited

FOREIGN PATENT DOCUMENTS

| | | | |
|---|---|---|---|
| JP | 2007-207935 | * | 8/2007 |
| JP | 2007-207935 | A | 8/2007 |
| JP | 2010-177474 | A | 8/2010 |
| JP | 2010-182857 | A | 8/2010 |

\* cited by examiner

SEMICONDUCTOR DEVICE AND METHOD FOR PRODUCING THE SAME

TECHNICAL FIELD

The present invention relates to a semiconductor device used for high power switching and a method for producing the semiconductor device, and particularly to a semiconductor device that uses a GaN-based semiconductor among nitride-based semiconductors and a method for producing the semiconductor device.

BACKGROUND ART

High reverse breakdown voltage and low on-resistance are required for high-current switching devices. Field effect transistors (FETs) that use a group III nitride-based semiconductor are excellent in terms of, for example, high breakdown voltage and high-temperature operation because of their wide band gap. Therefore, vertical transistors that use a GaN-based semiconductor have been particularly receiving attention as transistors for controlling high power. For example, PTL 1 proposes a vertical GaN-based FET whose mobility is increased and whose on-resistance is decreased by forming an opening in a GaN-based semiconductor and forming a regrown layer including a channel of two-dimensional electron gas (2DEG) in a wall surface of the opening. In this vertical GaN-based FET, a structure including a p-type GaN barrier layer and the like is proposed in order to improve the breakdown voltage characteristics and pinch-off characteristics.

CITATION LIST

Patent Literature

PTL 1: Japanese Unexamined Patent Application Publication No. 2006-286942

SUMMARY OF INVENTION

Technical Problem

In the above vertical GaN-based FET, the breakdown voltage characteristics may be improved by a depletion layer formed in a pn junction between the p-type GaN barrier layer and an n$^-$-type GaN drift layer. However, the opening penetrates through the p-type GaN barrier layer and reaches the n$^-$-type GaN drift layer. Therefore, a gate electrode G faces a drain electrode without the p-type GaN barrier layer disposed therebetween. When the semiconductor device is used as a high-power switching device, a voltage of several hundred volts to one thousand and several hundred volts is applied between the source electrode (ground) and the drain electrode in the off-state. A voltage of about minus several volts is applied to the gate electrode in the off-state. Because of the high source-drain voltage, electric field concentration is generated in a bottom portion of the opening, in particular, in a portion of the n$^-$-type GaN drift layer near a ridge (corner in a sectional view) of the bottom portion. As a result, breakdown of a semiconductor occurs from an uneven portion or the like inevitably provided by the ridge of the bottom portion of the opening.

It is an object of the present invention to provide a vertical semiconductor device having an opening and including a channel and a gate electrode in the opening. In the semiconductor device, the breakdown voltage characteristics in the off-state are improved. It is another object of the present invention to provide a method for producing the semiconductor device.

Solution to Problem

A semiconductor device of the present invention is a vertical semiconductor device including a GaN-based stacked layer having an opening. In this semiconductor device, the GaN-based stacked layer includes n-type GaN-based drift layer/p-type GaN-based barrier layer/n-type GaN-based contact layer in that order to the top layer side, and the opening extends from a top layer and reaches the n-type GaN-based drift layer. The semiconductor device includes a regrown layer located so as to cover a wall surface and a bottom portion of the opening, the regrown layer including an electron drift layer and an electron source layer; a source electrode that is in contact with the regrown layer, the n-type GaN-based contact layer, and the p-type GaN-based barrier layer; a gate electrode located above the regrown layer in the opening; and a bottom insulating layer located below the gate electrode and only in the bottom portion of the opening.

In the vertical semiconductor device, a high voltage of several hundred volts to one thousand and several hundred volts is applied between the source electrode disposed on one principal surface (a top surface of the GaN-based semiconductor layer) and the drain electrode that faces the source electrode with the GaN-based semiconductor layer sandwiched therebetween. The source electrode is fixed at a ground potential and a high voltage is applied to the drain electrode. The gate electrode is held at minus several volts, such as −5 V, in the off-state for the purpose of opening and closing the channel. That is, in the off-state, the gate electrode has a minimum potential. The distance between the gate electrode and the drain electrode is smaller than the distance between the source electrode and the drain electrode. In the off-state, a voltage increased by −5 V is applied between the drain electrode and the gate electrode. In existing semiconductor devices, the gate electrode is in contact with a semiconductor layer and constitutes a metal portion of a Schottky structure.

According to this structure, the bottom insulating layer disposed in the bottom portion of the opening is present between the gate electrode having a minimum potential and the portion of the n-type GaN-based drift layer that is in contact with the bottom portion of the opening. Therefore, the distance between the gate electrode and the n-type GaN-based drift layer is increased by the thickness of the insulating layer. A protruding portion of the gate electrode fitted to a corner of the opening from the inside in existing semiconductor devices is separated from the corner. A Schottky structure formed by the gate electrode in existing devices as described above is changed into a metal insulator semiconductor (MIS) structure in the present invention. As a result, the electric field concentration generated in the n-type GaN-based drift layer that is in contact with the outside of the corner is reduced. Thus, the breakdown of the n-type GaN-based drift layer in that portion does not readily occur.

Regarding the conductivity type, n-type or p-type, the concentration of an impurity is not limited and may be any concentration from low concentration to high concentration.

The bottom insulating layer can be located on the regrown layer that covers the bottom portion of the opening.

Since the bottom portion and wall surface of the opening are covered with the regrown layer in a continuous manner, there are no irregular uneven portions accidentally formed at the corner or the like. Consequently, shape factors that promote local electric field concentration can be eliminated. Furthermore, by disposing the bottom insulating layer on the regrown layer that covers the bottom portion and wall surface of the opening in a continuous manner, the production process can be simplified.

The regrown layer can cover the wall surface of the opening and can be terminated at the n-type GaN-based drift layer that forms the bottom portion of the opening, and the bottom insulating layer can be located so as to cover the n-type GaN-based drift layer that is located in the bottom portion of the opening.

The bottom portion of the opening has a simple structure including metal (gate electrode)/bottom insulating layer/n-type GaN-based drift layer, which is a preferred structure in terms of breakdown voltage characteristics.

The semiconductor device can further include an insulating layer located below the gate electrode and on the regrown layer, the insulating layer being disposed at least on the wall surface of the opening.

By disposing the insulating layer below the gate electrode and on the channel, a gate leak current generated when positive voltage is applied to the gate electrode can be reduced, which allows high-current operation. Since the threshold voltage can be further shifted in a positive direction, normally-off is easily achieved.

The insulating layer can extend to the bottom portion of the opening in a continuous manner so as to be disposed on or below the bottom insulating layer located in the bottom portion. In this case, the thickness of the insulating layer and bottom insulating layer is increased in the bottom portion, which can further increase the distance between the gate electrode having a minimum potential in the off-state and the n⁻-type GaN drift layer. As a result, the electric field concentration in the portion of the n⁻-type GaN drift layer that is in contact with the corner can be further reduced.

The regrown layer can cover the wall surface of the opening and can be terminated at a position at which the wall surface and the bottom portion of the opening intersect each other, and the insulating layer can continuously extend from the wall surface of the opening so as to also serve as the bottom insulating layer and can be located so as to cover the n-type GaN-based drift layer that is located in the bottom portion of the opening.

A simple structure in which breakdown voltage characteristics are improved while characteristics such as normally-off are achieved can be obtained.

A method for producing a semiconductor device according to the present invention is a method for producing a vertical GaN-based semiconductor device. The production method includes a step of forming a p-type GaN-based barrier layer on an n-type GaN-based drift layer; a step of forming an n-type GaN-based contact layer on the p-type GaN-based barrier layer; a step of forming, by etching, an opening that extends from a top layer and reaches the n-type GaN-based drift layer; a step of epitaxially growing a regrown layer so as to cover a wall surface and a bottom portion of the opening, the regrown layer including an electron drift layer and an electron source layer; a step of forming a bottom insulating layer only in the bottom portion of the opening; and a step of forming a gate electrode on the bottom insulating layer.

According to this method, the bottom insulating layer is formed after the formation of the regrown layer and before the formation of the gate electrode. Therefore, the electric field concentration generated in the n-type GaN-based drift layer near the corner of the opening can be easily reduced.

In the step of growing the regrown layer, the regrown layer can be formed on the wall surface of the opening so as to be terminated at the n-type GaN-based drift layer that forms the bottom portion of the opening, or the regrown layer located in the bottom portion of the opening can be removed by etching; and then, in the step of producing the bottom insulating layer, the bottom insulating layer can be formed so as to cover the n-type GaN-based drift layer exposed in the bottom portion of the opening.

Alternatively, in the step of forming the regrown layer, the regrown layer can be formed so as to cover the wall surface and bottom portion of the opening; and, in the step of forming the bottom insulating layer, the bottom insulating layer can be formed on the regrown layer.

By either of the production methods, a semiconductor device in which electric field concentration does not readily occur due to the presence of the bottom insulating layer can be easily produced.

The method for producing a semiconductor device can further include a step of forming an insulating layer so as to be located below the gate electrode, the insulating layer being disposed at least on the wall surface of the opening, before the step of forming the gate electrode and after or before the step of forming the bottom insulating layer.

A gate leak current generated when positive voltage is applied to the gate electrode can be reduced and thus a semiconductor device in which high-current operation is achieved can be easily produced. Furthermore, by disposing the insulating layer, a semiconductor device in which normally-off is easily achieved can be produced.

Advantageous Effects of Invention

According to the semiconductor device of the present invention, in a vertical semiconductor device having an opening and including a channel and a gate electrode in the opening, the breakdown voltage characteristics in the off-state can be improved.

REFERENCE SIGNS LIST

Figure 1:
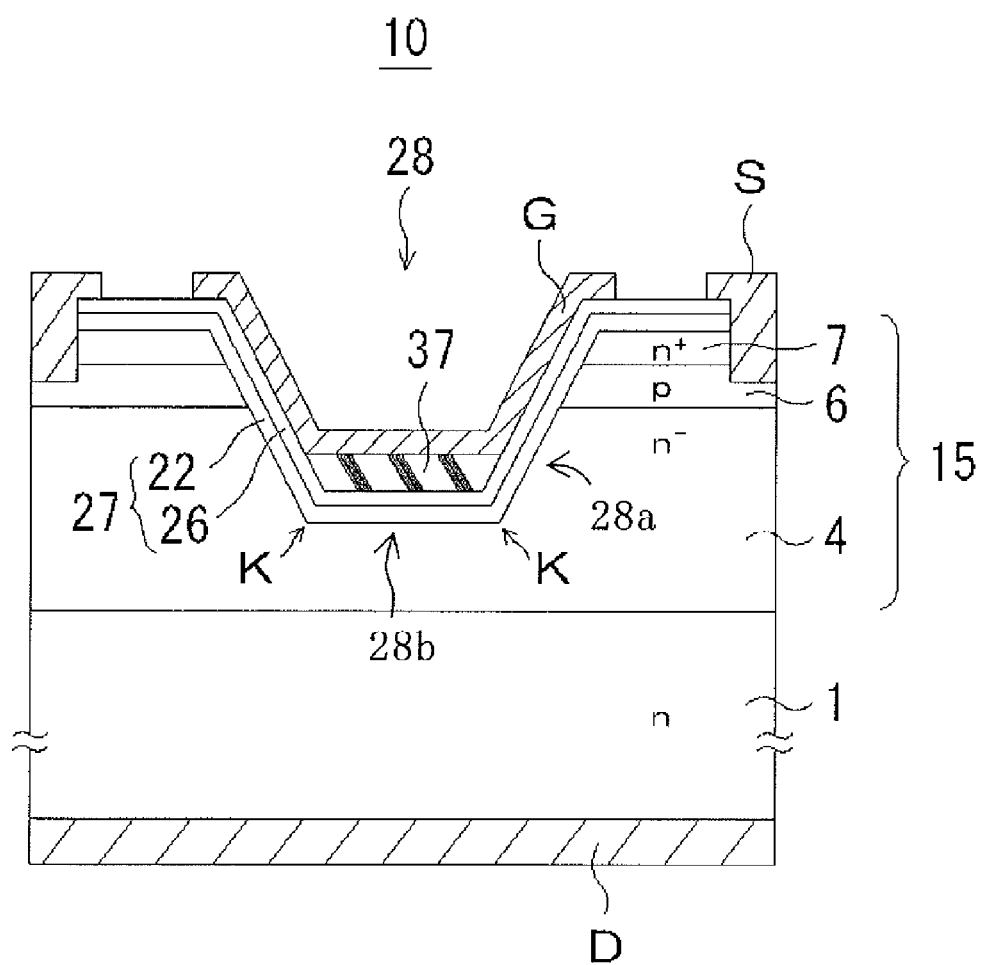
FIG. 1 is a sectional view showing a vertical GaN-based FET (semiconductor device) according to a first embodiment of the present invention (a sectional view taken along line I-I of FIG. 2).

1 GaN substrate
4 n⁻-type GaN drift layer
6 p-type GaN barrier layer
7 n⁺-type GaN contact layer
9 insulating layer
10 semiconductor device (vertical GaN-based FET)
12 gate wiring line
13 gate pad
15 GaN-based stacked layer
22 GaN electron drift layer
26 AlGaN electron source layer
27 regrown layer
28 opening
28a wall surface of opening
28b bottom portion of opening
37 bottom insulating layer
D drain electrode
G gate electrode
K ridge or corner of opening
M1 resist pattern
S source electrode

DESCRIPTION OF EMBODIMENTS

First Embodiment

FIG. 1 is a sectional view of a vertical GaN-based FET (semiconductor device) 10 according to a first embodiment of the present invention. The vertical GaN-based FET 10 includes a conductive GaN substrate 1 and n⁻-type GaN drift layer 4/p-type GaN barrier layer 6/n⁺-type GaN contact layer 7 epitaxially grown on the GaN substrate 1. The n⁻-type GaN drift layer 4/p-type GaN barrier layer 6/n⁺-type GaN contact layer 7 is successively formed to constitute a GaN-based stacked layer 15. A buffer layer composed of an AlGaN layer or GaN layer may be inserted between the GaN substrate 1 and the n⁻-type GaN drift layer 4 depending on the type of the GaN substrate 1.

The GaN substrate 1 may be a so-called monolithic, thick GaN substrate or a substrate including a GaN layer that is in ohmic contact with a support substrate. In addition, by forming a GaN layer on a GaN substrate or the like during the growth of a GaN-based stacked layer and then removing a portion having a certain thickness corresponding to the thickness of the GaN substrate or the like, only a thin GaN layer may be left as a base in the form of products. The GaN substrate, the substrate including a GaN layer that is in ohmic contact with a support substrate, and the thin GaN layer left as a base in the form of products may be simply referred to as a GaN substrate.

The thin GaN layer left as a base may be a conductive or nonconductive layer and a drain electrode can be disposed on the top or bottom surface of the thin GaN layer depending on the production process and the structure of products. In the case where the GaN substrate, the support substrate, or the like is left in a product, the support substrate or the substrate may be a conductive or nonconductive substrate. When the support substrate or the substrate is a conductive substrate, the drain electrode can be disposed directly on the bottom (lower) surface or top (upper) surface of the support substrate or the substrate. When the support substrate or the substrate is a nonconductive substrate, the drain electrode can be disposed above the nonconductive substrate and on a conductive layer located on the lower layer side in the semiconductor layers.

In this embodiment, the p-type GaN barrier layer 6 is used as the p-type GaN-based barrier layer, but a p-type AlGaN layer may be used. Regarding other layers constituting the stacked layer 15, other GaN-based semiconductor layers may be used instead of the GaN layers described above, if necessary.

In the GaN-based stacked layer 15, an opening 28 is formed so as to penetrate from the n⁺-type GaN contact layer 7 to the p-type GaN barrier layer 6 and reach the n⁻-type GaN drift layer 4. In the opening 28, a wall surface (side surface) 28a and a bottom portion 28b are exposed. A regrown layer 27 is epitaxially grown so as to cover the wall surface 28a and bottom portion 28b of the opening 28 and the top layer (n⁺-type GaN contact layer 7) of the GaN-based stacked layer 15. The regrown layer 27 is constituted by an intrinsic GaN (i-type GaN) electron drift layer 22 and an AlGaN electron source layer 26. An intermediate layer composed of AlN or the like may be inserted between the i-type GaN electron drift layer 22 and the AlGaN electron source layer 26. A source electrode S is electrically connected to the regrown layer 27, the n⁺-type contact layer 7, and the p-type GaN barrier layer 6. In FIG. 1, the source electrode S extends downwards and has a side surface that is in contact with the regrown layer 27 and the n⁺-type contact layer 7 and an end portion that is in contact with the p-type GaN barrier layer 6. Thus, an electrical connection is established. A drain electrode D is located on the bottom surface of the GaN substrate 1.

In the on-state, two-dimensional electron gas (2DEG) is generated in the i-type GaN electron drift layer at a position near the interface between the i-type GaN electron drift layer 22 and the AlGaN electron source layer 26 in the regrown layer 27. Such two-dimensional electron gas is generated in the i-type GaN electron drift layer 22 at a position near the interface between the i-type GaN electron drift layer 22 and the AlGaN layer due to, for example, spontaneous polarization or piezoelectric polarization caused by difference in lattice constant. Electrons that contribute to switching flow from the source electrode S to the drain electrode D through the two-dimensional electron gas and the n⁻-type GaN drift layer 4. Since the regrown layer 27 is formed by successively growing the i-type GaN electron drift layer 22 and the AlGaN electron source layer 26, the impurity level or the like at the interface therebetween can be reduced to a low level. Therefore, a high current (per unit area) can be caused to flow with low on-resistance while causing a high current to flow in a thickness direction by forming the opening 28.

The feature in this embodiment is the presence of a bottom insulating layer 37 located in the bottom portion 28b of the opening 28. The presence of the bottom insulating layer 37 increases a distance between the gate electrode G and the n⁻-type GaN drift layer 4 near the bottom portion of the opening. In particular, the n⁻-type GaN drift layer 4 that is in contact with, from the outside, a ridge or corner K at which the bottom portion 28b and wall surface 28a of the opening intersect each other is separated from the gate electrode G at a certain distance. An existing semiconductor device has a Schottky structure in which the gate electrode G is directly in contact with the regrown layer 27 or the n⁻-type GaN drift layer 4 whereas a semiconductor device in this embodiment has an MIS structure in which the bottom insulating layer 37 is present between the gate electrode G and the regrown layer 27.

As described above, in the off-state, a high voltage of several hundred volts to one thousand and several hundred volts is applied between the source electrode S held at a ground potential and the drain electrode D. The gate electrode is held at minus several volts, such as −5 V, in the off-state for the purpose of opening and closing the channel. In the off-state, the gate electrode has a minimum potential.

Existing semiconductor devices have a structure in which the gate electrode G fully covers the bottom portion 28b and wall surface 28a of the opening 28 in a continuous manner. In this structure, high electric field concentration is generated in a portion of the n⁻-type GaN drift layer 4 that is in contact with the corner K under the boundary conditions of the potential. In existing semiconductor devices, the gate electrode has a protruding portion fitted to the corner K from the inside. In the portion of the n⁻-type GaN drift layer 4 that is in contact with the corner K, the section containing electric lines of force becomes narrow in a direction from the outside toward the inside of the corner K, which increases the density of the electric lines of force. In a strict sense, it should be said that the protruding portion is fitted to the regrown layer that covers the corner K from the inside. However, the thickness of the regrown layer is small and thus the presence of the regrown layer provides only a small difference. When a great influence is not exerted, the description is made without strictly focusing on the presence or absence of the regrown layer.

Because of the presence of the protruding portion fitted to the corner K from the inside, high electric field concentration is generated in the portion of the n-type GaN-based drift layer 4 that is in contact with the protruding portion of the gate electrode G having a minimum potential. The n⁻-type GaN drift layer 4 in this portion may be broken as a result of this electric field concentration.

The gate electrode G of the semiconductor device 10 according to this embodiment is separated from the n⁻-type GaN drift layer 4 that is in contact with the bottom portion 28b of the opening 28 by the bottom insulating layer 37 at a certain distance. In particular, the gate electrode G does not have a portion fitted to the corner K of the opening 28 from the inside. By increasing the thickness of the bottom insulating layer 37, the electric field concentration in the portion of the n⁻-type GaN drift layer 4 that is in contact with the corner is reduced. As a result, high electric field concentration is not generated in the portion of the n⁻-type GaN drift layer 4 that is in contact with the ridge or corner K and thus dielectric breakdown caused by high voltage does not readily occur.

As the thickness of the bottom insulating layer 37 increases, the distance between the gate electrode G having a minimum potential and the n⁻-type GaN drift layer 4 increases. Therefore, the thickness of the bottom insulating layer 37 is preferably three times or more and more preferably five times or more the thickness of the regrown layer 27 (22, 26). Since the thickness of the regrown layer 27 is at most about 0.3 µm, the thickness of the bottom insulating layer 37 is preferably 0.9 µm (three times) or more and more preferably 1.5 µm (five times) or more.

The bottom insulating layer 37 can be composed of, for example, $Al_2O_3$, $SiO_2$, SiN, NiO, or $Sc_2O_3$.

The p-type impurity concentration of the p-type GaN barrier layer 6 may be about $1\times10^{17}$ (1E17) $cm^{-3}$ to $1\times10^{19}$ (1E19) $cm^{-3}$. The p-type impurity may be an impurity, such as Mg, that forms an acceptor in a GaN-based semiconductor. The thickness of the p-type GaN barrier layer 6 is dependent on, for example, the thickness of the n⁻-type GaN drift layer, and thus the range of the thickness cannot be determined in a general manner. However, the typical thickness often used in many devices is about 0.3 µm to 1 µm. If the thickness is less than 0.3 µm, breakdown voltage characteristics and pinch-off characteristics cannot be sufficiently produced and thus 0.3 µm may be set as the lower limit of thickness. If the p-type GaN barrier layer 6 having a thickness of about 0.3 µm to 1 µm has an excessively high Mg content, straight movement toward the end face of the p-type GaN barrier layer 6 occurs, which adversely affects the channel. The reverse voltage characteristics (breakdown voltage characteristics) at a pn junction between the p-type GaN barrier layer 6 and the n⁻-type GaN drift layer during channel interruption are also degraded.

The thickness of the n⁺-type GaN contact layer 7 may be about 0.1 µm to 0.6 µm. The length of the n⁺-type GaN contact layer 7 may be 5 µm or less.

Figure 2:
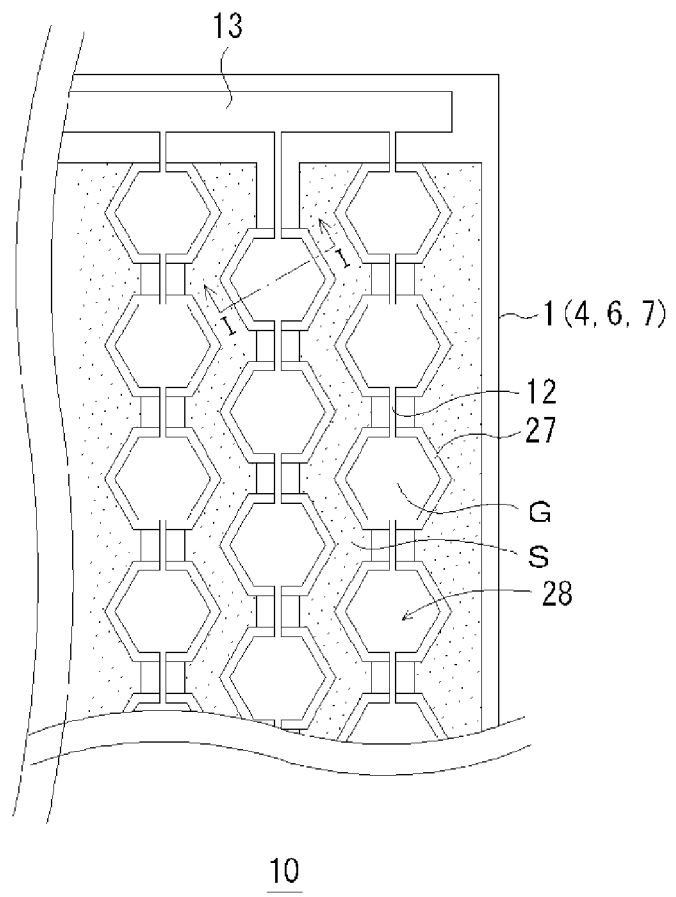
FIG. 2 is a plan view of the vertical GaN-based FET in FIG. 1.

FIG. 2 is a plan view of the vertical GaN-based semiconductor device 10 shown in FIG. 1, and FIG. 1 is a sectional view taken along line I-I of FIG. 2. Referring to FIG. 2, the opening 28 and the gate electrode G have a hexagonal shape and a region around the gate electrode G is substantially covered with the source electrode S while the source electrode S does not overlap a gate wiring line 12. Consequently, a closest-packed structure (honey-comb structure) is formed and thus the gate electrode has a long perimeter per unit area. By employing such a shape, the on-resistance can also be decreased. An electric current flows from the source electrode S and enters a channel (electron drift layer 22) in the regrown layer 27 directly or through the n⁺-type GaN contact layer 7. Then, the electric current flows to the drain electrode D through the n⁻-type GaN drift layer 4. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive portion obtained by filling the via hole is conductively connected to a source conductive layer (not shown) on the interlayer-insulating layer. As a result, a source structure including the source electrode S can have low electrical resistance and high mobility, which are suitable for high-power devices.

The perimeter of openings per unit area can also be increased by densely arranging elongated openings instead of employing the hexagonal honey-comb structure. Consequently, the current density can be improved.

Figure 3:
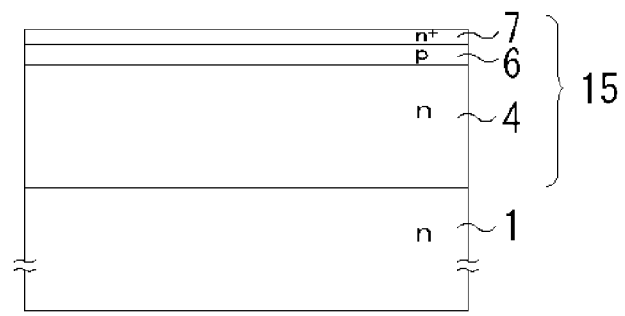
FIG. 3 is a diagram showing a method for producing the vertical GaN-based FET in FIG. 1, the diagram showing the state in which an epitaxial stacked layer including layers up to a contact layer has been formed on a substrate including a GaN layer that is in ohmic contact with a support substrate.

A method for producing the semiconductor device 10 according to this embodiment will be described. As shown in FIG. 3, a stacked layer 15 including n⁻-type GaN drift layer 4/p-type GaN barrier layer 6/n⁺-type GaN contact layer 7 is grown on a GaN substrate 1 corresponding to the above-described GaN substrate. A GaN-based buffer layer (not shown) may be inserted between the GaN substrate 1 and the n⁻-type GaN drift layer 4.

The formation of the above layers may be performed by, for example, metal-organic chemical vapor deposition (MOCVD). By performing growth using MOCVD, a stacked layer 15 having good crystallinity can be formed. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas. The purity of the high-purity ammonia is 99.999% or more and the purity of the purified hydrogen is 99.999995% or more. A hydrogen-based silane may be used as a Si raw material for an n-type dopant (donor) and cyclopentadienyl magnesium may be used as a Mg raw material for a p-type dopant (acceptor).

A conductive GaN substrate having a diameter of two inches is used as the conductive substrate. The substrate is cleaned at 1030° C. at 100 Torr in an atmosphere of ammonia and hydrogen. Subsequently, the temperature is increased to 1050° C. and a gallium nitride layer is grown at 200 Torr at a V/III ratio of 1500, which is the ratio of the nitrogen raw material and gallium raw material. The formation method of the GaN layer on the conductive substrate is employed for not only the formation of the GaN substrate 1 but also the growth of the stacked layer 15 on the GaN substrate 1.

By employing the above-described method, the n⁻-type GaN drift layer 4/p-type GaN barrier layer 6/n⁺-type GaN contact layer 7 is grown on the GaN substrate 1 in that order.

Figure 4:
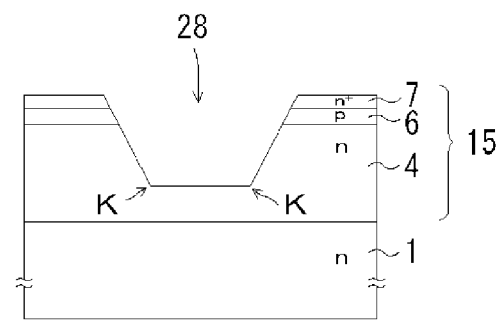
FIG. 4 is a diagram showing the state in which an opening has been formed by etching.
Figure 5A:
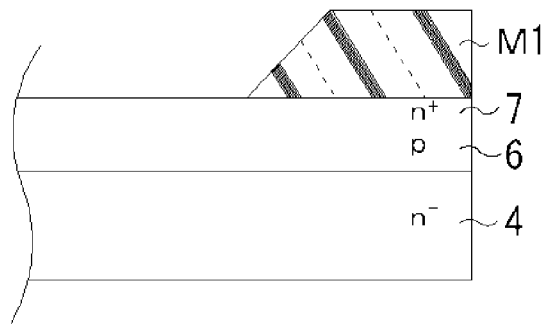
FIG. 5A is a diagram showing the state in which, at the stage of forming an opening by RIE, a resist pattern has been formed.
Figure 5B:
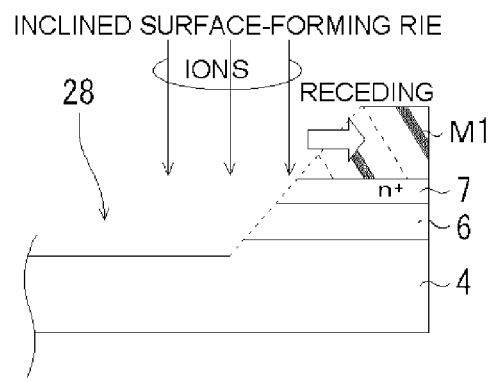
FIG. 5B is a diagram showing the state in which, at the stage of forming an opening by RIE, the stacked layer is etched down by performing ion irradiation and an opening is expanded (caused to recede).

Subsequently, as shown in FIG. 4, an opening 28 is formed by reactive ion etching (RIE). As shown in FIGS. 5A and 5B, a resist pattern M1 is formed on the top of epitaxial layers 4, 6, and 7. The resist pattern M1 is then etched by RIE to cause the resist pattern M1 to recede, whereby an opening is expanded to form an opening 28. In this RIE process, the inclined surface of the opening 28, that is, the end face of the stacked layer 15 is damaged by being subjected to ion irradiation. In the damaged portion, for example, a high-density region of dangling bonds and lattice defects is formed. Conductive impurities derived from an RIE equipment or unspecified sources reach the damaged portion and thus enrichment occurs. The formation of the damaged portion results in an increase in drain leak current and thus the restoration needs to be performed. When hydrogen and ammonia are contained at certain levels, the restoration regarding the dangling bonds and the like and the removal and passivation of the impurities can be achieved during the growth of a regrown layer 27 described below.

Figure 6:
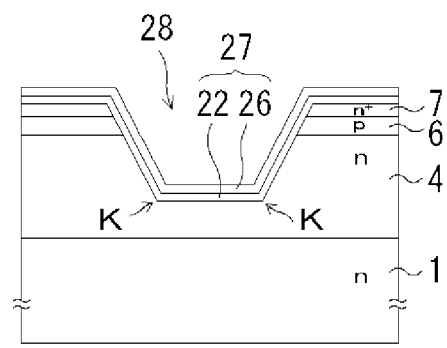
FIG. 6 is a diagram showing the state in which a regrown layer has been formed in the opening.

Subsequently, the resist pattern M1 is removed and the wafer is cleaned. The wafer is inserted into an MOCVD apparatus and a regrown layer 27 including an electron drift layer 22 composed of undoped GaN and an electron source layer 26 composed of undoped AlGaN is grown as shown in FIG. 6. In the growth of the undoped GaN layer 22 and undoped AlGaN layer 26, thermal cleaning is performed in an atmosphere of $(NH_3+H_2)$, and then an organic metal material is supplied while $(NH_3+H_2)$ is being introduced. In the thermal cleaning before the formation of the regrown layer 27 or in the formation of the regrown layer 27, the restoration regarding the damaged portion and the removal and passivation of the conductive impurities are allowed to proceed.

Figure 7:
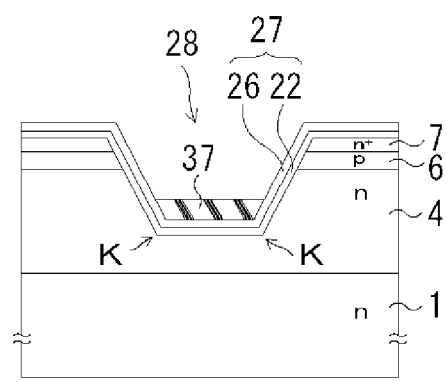
FIG. 7 is a diagram showing the state in which a bottom insulating layer has been formed on the regrown layer in a bottom portion of the opening.

Subsequently, the wafer is taken out of the MOCVD apparatus. As shown in FIG. 7, a bottom insulating layer 37 is grown using a resist pattern (not shown) having a hole in the bottom portion of the opening.

A source electrode S and a drain electrode D are formed on the top surface of the epitaxial layer and the bottom surface of the GaN substrate 1, respectively, by photolithography and electron beam deposition as shown in FIG. 1.

<Modification of Semiconductor Device in FIG. 1>

Figure 8:
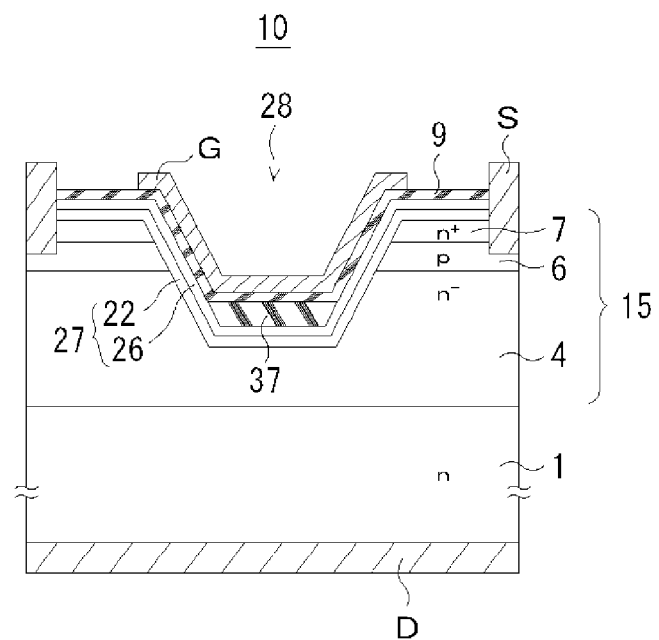
FIG. 8 is a sectional view of a semiconductor device that belongs to the first embodiment of the present invention, which is a modification of the semiconductor device in FIG. 1.

FIG. 8 shows a semiconductor device 10 according to an embodiment of the present invention, which is a modification of the first embodiment. In this modification, an insulating layer 9 is disposed below the gate electrode G unlike the semiconductor device in FIG. 1.

By disposing the insulating layer below the gate electrode, a gate leak current generated when positive voltage is applied to the gate electrode is reduced, which allows high-current operation. Since the threshold voltage can be further shifted in a positive direction, normally-off is easily achieved. Furthermore, since the bottom insulating layer 37 and the insulating layer 9 are stacked, the distance between the gate electrode G and the n⁻-type GaN drift layer 4 is increased. Consequently, the electric field concentration in the portion of the n⁻-type GaN drift layer 4 that is in contact with the corner K can be further reduced.

The thickness of the insulating layer 9 may be about 0.05 μm or more and 0.3 μm or less. The insulating layer 9 can also be composed of, for example, $Al_2O_3$, $SiO_2$, SiN, NiO, or $Sc_2O_3$ like the bottom insulating layer 37.

The insulating layer 9 may be located below the bottom insulating layer 37 and on the regrown layer 27.

Second Embodiment

Figure 9:
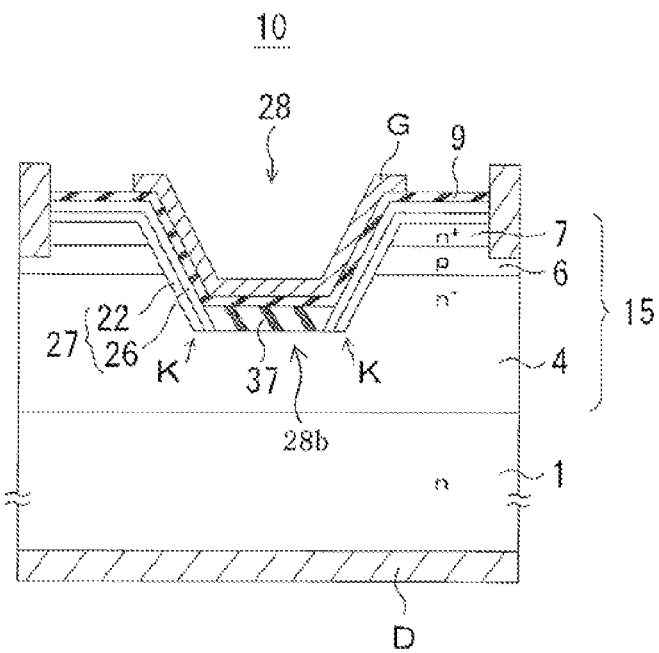
FIG. 9 is a sectional view showing a vertical GaN-based FET (semiconductor device) according to a second embodiment of the present invention.

FIG. 9 is a sectional view showing a vertical GaN-based FET (semiconductor device) 10 according to a second embodiment of the present invention. The following structure is the same as in the first embodiment. The GaN-based stacked layer 15 includes n⁻-type GaN drift layer 4/p-type GaN barrier layer 6/n⁺-type GaN contact layer 7 and the opening 28 is formed so as to extend from the top layer and reach the n⁻-type GaN drift layer 4.

The features of the semiconductor device 10 according to this embodiment are as follows.

(1) The bottom insulating layer 37 is disposed in the bottom portion 28b of the opening 28. This structure is the same as that of the semiconductor device of the first embodiment shown in FIG. 1 or the semiconductor device of the modification shown in FIG. 8.

(2) The regrown layer is not disposed in the bottom portion 28b of the opening 28, and the regrown layer 27 extends along the wall surface of the opening 28 and is terminated at a position at which the wall surface and bottom portion of the opening intersect each other.

The feature (2) does not make an essential difference between the semiconductor device 10 of this embodiment and the semiconductor device of the first embodiment. In cooperation with the insulating layer 9, the bottom insulating layer 37 increases the distance between the portion of the n⁻-type GaN drift layer 4 that is in contact with the corner K of the opening 28 and the gate electrode G having a minimum potential. As a result, the electric field concentration at the corner K in the n⁻-type GaN drift layer 4 can be reduced as in the first embodiment.

The effect achieved by disposing the insulating layer 9 below the gate electrode is the same as in the first embodiment. That is, a gate leak current generated when positive voltage is applied to the gate electrode is reduced by disposing the insulating layer on the channel and below the gate electrode, which allows high-current operation. Furthermore, since the threshold voltage can be further shifted in a positive direction, normally-off is easily achieved.

The insulating layer 9 in FIG. 9 is disposed on the bottom insulating layer 37, but may be disposed below the bottom insulating layer 37. The effect of the insulating layers 37 and 9 in the bottom portion 28b of the opening 28 is not affected by the order of the insulating layers stacked in the bottom portion.

The insulating layer 9 is not necessarily disposed. If the insulating layer 9 is disposed, the above-described effect can be produced. However, when an object is limited to an improvement in breakdown voltage characteristics or the like, the insulating layer 9 is unnecessary.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

INDUSTRIAL APPLICABILITY

According to the semiconductor device or the like of the present invention, in a vertical semiconductor device having an opening, the breakdown voltage characteristics in the off-state can be improved by disposing an insulating layer only in a bottom portion of the opening. Such a semiconductor device has both low-on resistance achieved by forming two-dimensional electron gas along a wall surface of the opening in a thickness direction and good breakdown voltage characteristics achieved as described above. Therefore, the semiconductor device can be used as a high-current switching device.

The invention claimed is:

1. A vertical semiconductor device including a GaN-based stacked layer having an opening,
the GaN-based stacked layer including n-type GaN-based drift layer/p-type GaN-based barrier layer/n-type GaN-based contact layer in that order to a top layer side, the opening extending from a top layer and reaching the n-type GaN-based drift layer, the semiconductor device comprising:
a regrown layer located so as to cover a wall surface and a bottom portion of the opening, the regrown layer including an electron drift layer and an electron source layer;
a source electrode that is in contact with the regrown layer, the n-type GaN-based contact layer, and the p-type GaN-based barrier layer;
a gate electrode located above the regrown layer in the opening; and
a bottom insulating layer located below the gate electrode and only in the bottom portion of the opening,
wherein the bottom insulating layer is located on the regrown layer that covers the bottom portion of the opening.

2. A vertical semiconductor device including a GaN-based stacked layer having an opening,
the GaN-based stacked layer including n-type GaN-based drift layer/p-type GaN-based barrier layer/n-type GaN-based contact layer in that order to a top layer side, the opening extending from a top layer and reaching the n-type GaN-based drift layer, the semiconductor device comprising:
a regrown layer located so as to cover a wall surface and a bottom portion of the opening, the regrown layer including an electron drift layer and an electron source layer;
a source electrode that is in contact with the regrown layer, the n-type GaN-based contact layer, and the p-type GaN-based barrier layer;
a gate electrode located above the regrown layer in the opening; and
a bottom insulating layer located below the gate electrode and only in the bottom portion of the opening,
wherein the regrown layer covers the wall surface of the opening and is terminated at the n-type GaN-based drift layer that forms the bottom portion of the opening, and the bottom insulating layer is located so as to cover the n-type GaN-based drift layer that is located in the bottom portion of the opening.

3. A vertical semiconductor device including a GaN-based stacked layer having an opening,
the GaN-based stacked layer including n-type GaN-based drift layer/p-type GaN-based barrier layer/n-type GaN-based contact layer in that order to a top layer side, the opening extending from a top layer and reaching the n-type GaN-based drift layer, the semiconductor device comprising:
a regrown layer located so as to cover a wall surface and a bottom portion of the opening, the regrown layer including an electron drift layer and an electron source layer;
a source electrode that is in contact with the regrown layer, the n-type GaN-based contact layer, and the p-type GaN-based barrier layer;
a gate electrode located above the regrown layer in the opening;
a bottom insulating layer located below the gate electrode and only in the bottom portion of the opening; and
an insulating layer located below the gate electrode and on the regrown layer, the insulating layer being disposed at least on the wall surface of the opening.

4. The semiconductor device according to claim 3, wherein the regrown layer covers the wall surface of the opening and is terminated at a position at which the wall surface and the bottom portion of the opening intersect each other, and the insulating layer continuously extends from the wall surface of the opening so as to also serve as the bottom insulating layer and is located so as to cover the n-type GaN-based drift layer that is located in the bottom portion of the opening.

* * * * *